United States Patent [19]
He et al.

[11] Patent Number: 6,037,614
[45] Date of Patent: Mar. 14, 2000

[54] METHODS FOR MANUFACTURING GROUP IV ELEMENT ALLOY SEMICONDUCTOR MATERIALS AND DEVICES THAT INCLUDE SUCH MATERIALS

[75] Inventors: Gang He, Colorado Springs, Colo.; Harry A. Atwater, S. Pasadena, Calif.

[73] Assignee: California Institute of Technology, Pasadena, Calif.

[21] Appl. No.: 09/036,182

[22] Filed: Mar. 6, 1998

Related U.S. Application Data

[60] Provisional application No. 60/040,621, Mar. 7, 1997.

[51] Int. Cl.[7] .................. H01L 31/0328; H01L 31/0336; H01L 31/072; H01L 31/109
[52] U.S. Cl. ......................... 257/184; 257/188; 257/441; 420/556; 117/108; 117/939
[58] Field of Search .................................... 428/620, 641, 428/646, 647, 648; 420/556, 557; 117/108, 936, 939; 257/188, 441, 184

[56] References Cited

U.S. PATENT DOCUMENTS

| | | | |
|---|---|---|---|
| 3,615,856 | 10/1971 | Sommers | 136/321 |
| 3,966,470 | 6/1976 | Feltz et al. | 430/86 |
| 4,492,810 | 1/1985 | Ovshinsky et al. | 136/255 |
| 4,769,341 | 9/1988 | Luryi | 117/105 |

OTHER PUBLICATIONS

Ormer, B.A. et al., "Optical absorption in alloys of Si, Ge, C and Sn", Journal of Applied Physics, vol. 79 (11): 8656–8659, Jun. 1, 1996.

Lew Yan Voon, L.C. et al., "Investigation of inversion asymmetry effects on the band structure of Sn(i)Ge(j) superlattices", Solid–State Electronics, vol. 40 (1–8): 191–196, 1996.

Bennett, J.C. et al., "Fabrication of Sn(x)Ge(1–x) thin films with non–equilibrium composition", Vacuum vol. 47 (12): 1419–22, 1996.

Atwater et al., "Epitaxial Growth of Metastable $Sn_xG_{1-x}$ Alloy Films By Ion–Assisted Molecular Beam Epitaxy", *Mat. Res. Soc. Symp. Proc.*, 355:123–134 (1995).

He et al., "Synthesis of Dislocation Free $Si_y(Sn_xC_{1-x})_{1-y}$ Alloys By Molecular Beam Deposition and Solid Phase Epitaxy", *Mat. Res. Soc. Symp. Proc.*, 298:229–233 (1993).

He et al., "Synthesis of Epitaxial $Sn_xGe_{1-x}$ Alloy Films By Ion–assisted Molecular Beam Epitaxy", *Nuclear Instruments and Methods in Physics Research B*, 106:126–132 (1995).

He et al., "Interband Transitions in $Sn_xGe_{1-x}$ Alloys", *Phys. Rev. Lett.*, 79(10):1937–1940 Sep. 8, 1997.

He et al., "Synthesis of Epitaxial $Sn_xGe_{1-x}$ Alloy Films by Ion–Assisted Molecular Beam Epitaxy", *Appl. Phys. Lett.*, 68(5):664–666, Jan. 29, 1996.

He et al., "Synthesis of Dislocation Free $Si_y(Sn_xC_{1-x})_{1-y}$ Alloys by Molecular Beam Deposition and Solid Phase Epitaxy", *Appl. Phys. Lett.* 65(9)1159–1161, Aug. 29, 1994.

M.E. Taylor et al., "Solid Phase Epitaxy of Diamond Cubic $Sn_xGe_{1-x}$ Alloys", *J. Appl. Phys.*, 80(8):4384–4388 Oct. 15, 1996.

Primary Examiner—Benjamin L. Utech
Assistant Examiner—Donald L. Champagne
Attorney, Agent, or Firm—Fish & Richardson P.C.

[57] ABSTRACT

$Sn_xGe_{1-x}$ alloys that are substantially free of compositional inhomogeneities and Sn segregation, and have a measurable direct band gap. Methods for making the $Sn_xGe_{1-x}$ alloys are also disclosed.

11 Claims, 5 Drawing Sheets

- ◨ Measured Energy Band Gap
- —— Parabolic Fit
- ------ Tight-Binding Calculation (Direct Gap) [Jenkins et al.]
- △ DFT Calculation of Zinc-Blende SnGe [Brudevoil et al.]

METHODS FOR MANUFACTURING GROUP IV ELEMENT ALLOY SEMICONDUCTOR MATERIALS AND DEVICES THAT INCLUDE SUCH MATERIALS

CROSS REFERENCE TO RELATED APPLICATIONS

This application claims priority to U.S. Provisional Application Ser. No. 60/040,621 filed Mar. 7, 1997.

STATEMENT AS TO FEDERALLY SPONSORED RESEARCH

This work was supported in part by the National Science Foundation under award number 9503210.

BACKGROUND OF THE INVENTION

The present invention relates to manufacturing group IV element alloys.

Semiconductor materials based on silicon technology are utilized extensively in electronics. The inherent electronic properties of silicon, however, limit silicon applications in optoelectronic devices and very high speed electronic devices.

Alloys of group IV elements, which include carbon (C), silicon (Si), germanium (Ge), tin (Sn), and lead (Pb), have been investigated for their utility in semiconductor devices. Group IV elements are isoelectronic and, as a result, have similarities in their physical and chemical properties. Except for lead, all of the first four group IV elements have stable or metastable phases in diamond-cubic crystal structure, which is the crystal structure of semiconductor silicon. Bulk Sn transforms from α-phase (i.e., diamond-cubic) to β-phase (i.e., body centered tetragonal) at about 13.2° C. Thin film α-Sn, however, can be epitaxially stabilized on substrates with similar lattice constants at much higher temperatures (e.g., about 130° C.).

SnGe is a thermodynamic metastable group IV alloy that exhibits a simple eutectic system having a eutectic temperature of about 231° C., with mutual equilibrium solubilities no more than 1 atomic %. The limited solid solubility and the surface free energy difference between Sn and Ge, tend to cause Sn to segregate to the surface during SnGe alloy growth.

SUMMARY OF THE INVENTION

The invention features $Sn_xGe_{1-x}$ alloys substantially free of compositional inhomogeneities having a measurable direct band gap. The invention also features the optical characterization and band gap determination of $Sn_xGe_{1-x}$ alloys. Theoretical band gap calculations have suggested that, while tin is a semi-metal and germanium is an indirect band gap semiconductor, diamond-cubic $Sn_xGe_{1-x}$ alloys may have a direct band gap that is continuously tunable from $0.55 \geq x \geq 0$ eV for compositions where $0.2 \leq x \leq 0.6$. The inventors' results indicate that the direct band gap of 0 eV can be achieved at tin concentrations less than about 0.34.

In one aspect, the invention features a $Sn_xGe_{1-x}$ alloy substantially free of compositional inhomogeneities and Sn segregation, and having a measurable direct band gap. Useful direct band gaps are in the range of about 0.62 eV to about 0 eV, about 0.62 eV to about 0.35 eV, and no greater than about 0.20 eV. Useful $Sn_xGe_{1-x}$ alloy compositions include $0<x\leq0.34$, $0<x\leq0.30$, $0<x\leq0.22$, $0.06<x\leq0.22$, $0.06<x\leq0.15$ and $0.11<x\leq0.15$.

In another aspect, the invention features a method of forming a $Sn_xGe_{1-x}$ alloy on a silicon or germanium substrate by ion-assisted molecular beam epitaxy. The method includes maintaining the substrate at a temperature no greater than about 200° C.; and maintaining the ion flux such that the alloy is substantially free of compositional inhomogeneities and Sn segregation, and has a measurable direct band gap. In one embodiment, the silicon or germanium substrate includes an integrated circuit. In other embodiments, the substrate is maintained at a temperature between about 150° C. and 200° C., more preferably at about 180° C. In some embodiments, the ion flux is less than 50 eV $Ar^+$ ions. In preferred embodiments, the ion flux is between about 30 eV and 40 eV $Ar^+$ ions.

In another embodiment, the invention features a method of forming a $Sn_xGe_{1-x}$ alloy on a silicon or germanium substrate by molecular beam epitaxy. The method includes maintaining the substrate at a temperature no greater than about 200° C. such that said alloy is substantially free of compositional inhomogeneities and Sn segregation, and has a measurable direct band gap.

In another aspect, the invention features a method of forming an optoelectronic device. The method includes forming $Sn_xGe_{1-x}$ alloy on a silicon or germanium substrate by molecular beam epitaxy; and maintaining the substrate at a temperature no greater than about 200° C. such that the alloy is substantially free of compositional inhomogeneities and Sn segregation, and has a measurable direct band gap.

In another aspect, the invention features a monolithic integrated array that includes a $Sn_xGe_{1-x}$ alloy on a silicon or germanium substrate. The $Sn_xGe_{1-x}$ alloy is substantially free of compositional inhomogeneities and Sn segregation, and has a measurable direct band gap.

The use of high flux, low energy ion beam irradiation in methods for manufacturing epitaxial $Sn_xGe_{1-x}$ alloy films greatly inhibits tin segregation without interrupting epitaxy during epitaxial growth of $Sn_xGe_{1-x}$ alloy films, particularly $Sn_xGe_{1-x}$ alloy films where $x\geq0.15$. Molecular beam epitaxy conducted with controlled temperature and, for ion-assisted epitaxy, controlled ion flux levels, enables the growth of substantially homogeneous $Sn_xGe_{1-x}$ alloys substantially free of Sn segregation, and having a measurable direct band gap.

Other features and advantages of the invention will be apparent form the description of the preferred embodiment thereof, and from the claims.

DESCRIPTION OF THE PREFERRED EMBODIMENTS $Sn_xGe_{1-x}$ alloys were synthesized using methods to control Sn segregation and compositional homogeneity. Two analytical models quantitatively describe surface segregation and its suppression during energetic beam deposition in general. The models expand the existing kinetic model that describes the partitioning processes during conventional epitaxial growth by including the effect of energetic beam induced atom incorporation into alloys. The models include the effect of both recoil implantation and direct implantation and predict the degree of segregation as a function of irradiating ion flux.

Segregation Model for Thermal Molecular Beam Epitaxy

In conventional treatment of surface segregation during step-wise thermal growth, a segregation coefficient k of atomic species B is defined in alloy $B_xA_{1-x}$ as the ratio of bulk composition $x^\beta$ to surface composition $x^\sigma$:

$$k = x^\beta/x^\sigma.$$

In the model, A and B correspond to Ge and Sn, respectively. At thermodynamic equilibrium, the segregation coefficient $k_e$ of a regular solution can be expressed in terms of the partition parameter $\kappa_e$ which depends on the difference in surface free energy $\gamma^A$ and $\gamma^B$ between the two chemical species A and B and the difference of the interaction parameters $\Omega^\beta$ and $\Omega^\sigma$ between the bulk and surface phases β and σ, respectively:

$$k_e = \frac{1-x^\beta}{1-x^\sigma}\kappa_e,$$

where $$\kappa_e = e^{-(\gamma A - \gamma B + \Omega\beta - \Omega\sigma)/\kappa T}$$

is the driving force for segregation.

The steady state segregation coefficient for periodic steps is:

$$k_{per} = k_e^* + \frac{1-k_e^*}{e^{P_D}}, \text{ (periodic steps)},$$

where:

$$k_e^* = \kappa_e/(1 - \chi^\sigma + \kappa^*\chi^\sigma), \text{ and}$$

$$P_D = \frac{D^*}{a^2 j},$$

where:

$$D^* = D(1 - \chi^\sigma + \kappa_e\chi^\sigma).$$

Another solution is possible for aperiodically spaced steps:

$$k_{aper} = k_e^* + \frac{1-k_e^*}{1+P_D} \text{ (aperiodic steps)}.$$

Figure 1:
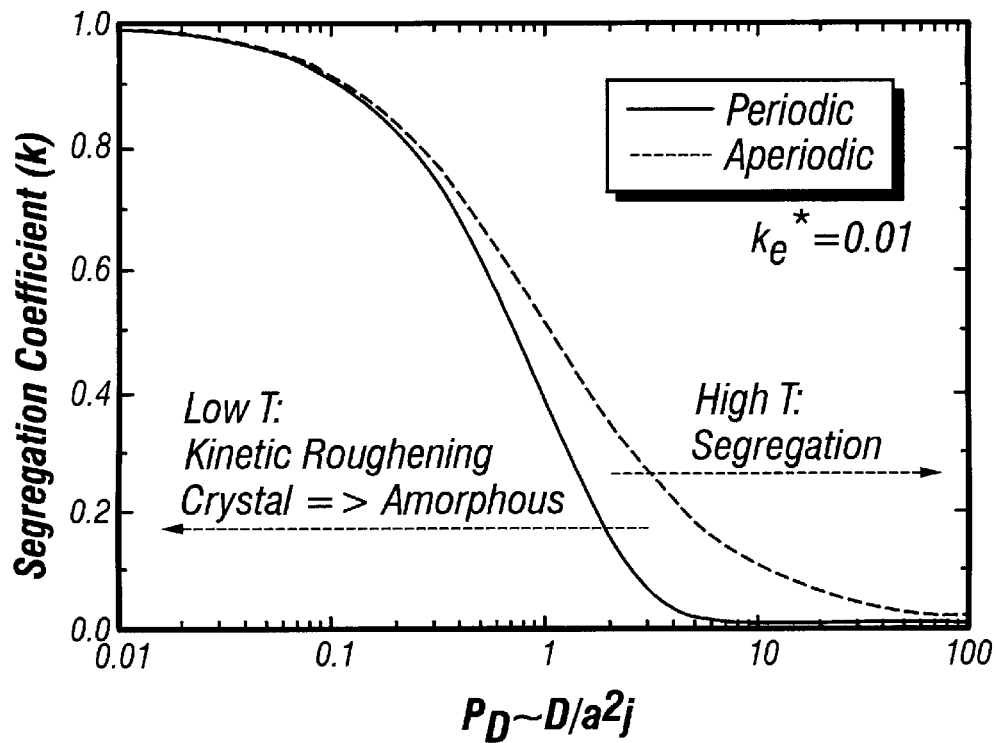
FIG. 1 is a plot of the steady-state segregation coefficient as a function of the ratio of diffusion-flux, D, to growth-atom, j, during thermal epitaxial growth.

Referring to FIG. 1, a plot of the steady-state segregation coefficient as a function of the ratio of diffusion-flux, D, to growth-atom, j, during thermal epitaxial growth, is shown.

Segregation Model for Ion-Assisted Molecular Beam Epitaxy

For energetic beam deposition, there is beam-induced mixing between the surface and subsurface monolayers which inhibits the surface segregation. Such beam-induced mixing effects can be caused by the processes of subsurface recoil-implantation and direct subsurface implantation. In the process of subsurface recoil-implantation, the incoming energetic ions impinge on the surface atoms and produce recoil events that implant the surface atoms into the subsurface layer. This process occurs for most energetic beam deposition growth methods (e.g., ion-assisted epitaxial growth). In the process of direct subsurface implantation, the deposition flux itself contains energetic components that may directly implant the deposition species into the subsurface layer. This process occurs for growth methods such as direct ion beam deposition, sputter deposition, and pulsed laser deposition.

In the process of subsurface recoil implantation, the surface and subsurface atoms may exchange positions in both the forward and backward directions as a result of the recoil events.

The central rate equation for the model can be solved in analogy to the thermal segregation rate equation with the following steady-state solutions:

$$k_{per} = k^* + \frac{1-k^*}{e^{P^*}},$$

$$k_{aper} = k^* + \frac{1-k^*}{1+P^*},$$

where $k_{per}$ is the solution for perfectly periodic step flow growth and $k_{aper}$ is the solution for totally random aperiodic step flow growth, where:

$$P^* = P_D + P_R + P_I, \text{ and}$$

$$k^* = (P_D k_e^* + P_R k_R^* + P_I k^*_I)/P^*,$$

where:

$$P_D = \frac{D}{a^2 j},$$

$P_R = I\eta^*$, where I is the ion flux, $\eta^*$ is the recoil mixing efficiency, and $P_I$ is a dimensionless Pèclet number, which describes the effective direct-implant-flux to atom-flux ratio, $k_e^*$ has the same meaning as for thermal epitaxial growth.

$$k_R^* = \kappa_R/(1 - x^\sigma - \kappa_R x^\sigma), \text{ and}$$

$$k_I^* = X_I^*/X^\sigma.$$

Figure 2:
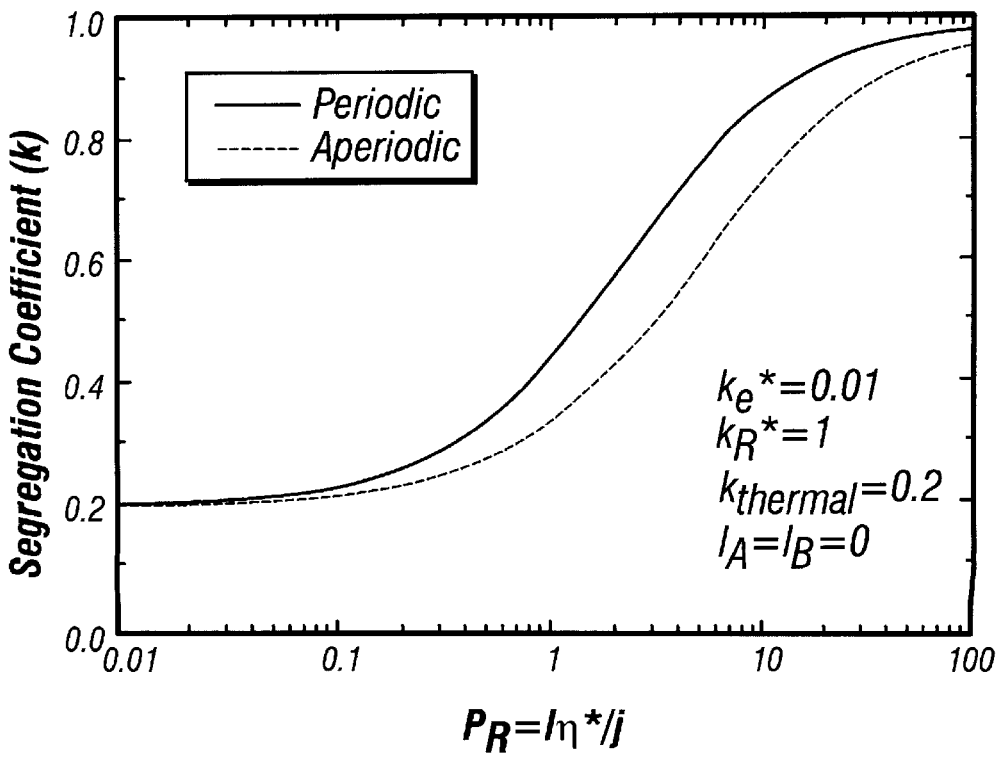
FIG. 2 is a plot of the steady state segregation coefficients s a function of ion flux to growth atom flux ratio during ion-assisted epitaxial growth.

Referring to FIG. 2, a plot of the steady state segregation coefficients s a function of ion flux to growth atom flux ratio during ion-assisted epitaxial growth, is shown.

Growth of $Sn_xGe_{1-x}$ Alloy Films by Ion-Assisted Molecular Beam Epitaxy $Sn_xGe_{1-x}$ alloys, where $0<x\leq0.34$, were prepared by ion-assisted molecular beam epitaxy. During the process, the irradiating ion energy was maintained at a level sufficiently low to avoid extended damage to the bulk crystal, and the ion flux was maintained at a level sufficiently high to generate sufficient surface mixing (i.e, surface atoms undergoing subsurface recoil implantation and generate collisional mixing between the surface and subsurface layers). Useful irradiating conditions were found to include: ion flux of 30–100 eV $Ar^+$ ions (preferably between 30 and 50 eV, more preferably between about 30 and 40 eV, most preferably 35 eV) energy produced by an electron cyclotron resonance ionization source with ion to atom flux ratios of the order of 0.1 to 1 (preferably 1); and a substrate temperature range of between about 150° C. to about 200° C., more preferably 120° C. to 200° C., most preferably 180° C. Optimized operation of electron cyclotron resonance ion source requires fine tuning of the microwave resonant cavity in the ion source. Adjustments to the cavity tuning are required during the operation in order to maintain optimum operation conditions.

Silicon (100) wafers were chemically cleaned by alternately placing the wafers in $H_2O:H_2O_2:NH_4OH$ 5:1:1 at 80° C. for 10 minutes, which caused a thin oxide layer to form on the surface of the wafer, and HF 5% for 30 seconds, which etched away the oxide layer and produced dihydride-terminated silicon surface. This process was repeated a total of three times. The cleaned silicon wafers were then transferred to an ultrahigh vacuum deposition chamber and prebaked at 200° C. for two hours. The silicon (100) wafer substrates were then heated to 550° C. to desorb the surface hydrogen and produce 2×1 reconstructed clean silicon surface. Epitaxial germanium buffer layers of 50 to 100 nm were deposited onto the cleaned silicon surface at 400° C. to 450° C. The finished germanium buffer layer surfaces were also 2×1 reconstructed and smooth (as judged qualitatively by in situ reflection high energy electron diffraction). The substrates were then cooled to temperatures ranging from 120° C. to 200° C.

Figure 3:
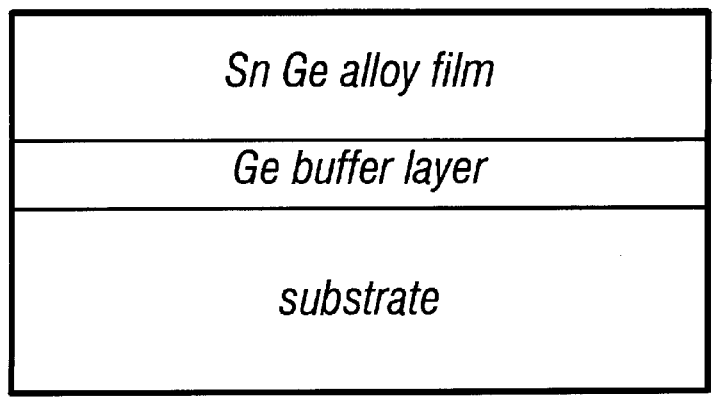
FIG. 3 is a schematic representation of a layered structure of $Sn_xGe_{1-x}$ samples after molecular beam epitaxy.

A set of $Sn_xGe_{1-x}$ samples having nominal tin concentrations ranging from $0.2\leq x\leq0.4$ were grown on the germanium buffer layers at temperatures ranging from 150° C. to 200° C. at growth rates of 0.05 nm/sec under ion irradiation conditions set forth above. A schematic representation of the layered structure of $Sn_xGe_{1-x}\backslash Ge\backslash Si(100)$ is shown in FIG. 3. The samples were characterized by optical microscopy, Rutherford backscattering spectroscopy with 2 MeV $He^{++}$, high resolution x-ray diffraction with $Cu-K_{\alpha 1}$ x-ray, and transmission electron microscopy.

A set of $Sn_xGe_{1-x}$ samples having nominal tin concentrations ranging from $0.3\leq x\leq0.4$ were grown at 150° C. (substrate temperature) in the presence of ion radiation produced by an electron cyclotron resonance ion source operated at 100 W microwave power under 10 sccm argon gas flow (argon partial pressure of about $10^{-4}$ Torr). The substrates were electrically grounded during growth. The irradiating ion flux was approximately 0.05 mA/cm$^2$, and the ion energy was approximately 30 eV. The growth rate of each alloy layer was 0.05 nm/sec.

The samples were characterized by optical microscopy, Rutherford backscattering spectroscopy with 2 MeV $He^{++}$, high resolution x-ray diffraction with $Cu—K_{\alpha 1}$ x-ray, and transmission electron microscopy.

Optical microscopy showed optically clear sample surfaces for tin concentrations $x\leq0.35$ and optically rough sample surfaces covered with islands for tin concentrations $x\geq0.35$. The results of reflection high energy electron diffraction and surface optical microscopy were confirmed by Rutherford backscattering spectroscopy, which showed uniform alloy composition profile without surface segregation for tin concentrations $x\leq0.35$, including single crystal epitaxial $Sn_{0.34}Ge_{0.66}$ 230 nm thick and polycrystalline $Sn_{0.30}Ge_{0.70}$ 250 nm thick.

A set of $Sn_xGe_{1-x}$ samples where $0.2\leq x\leq0.3$ were grown at 200° C., at a rate of 0.05 nm/sec., and in the presence of ion radiation produced by an electron cyclotron resonance ion source. The growth conditions were similar to the 150° C. growth. The argon flow rate was about 10 sccm, which produced an argon background pressure of about $10^{-4}$ Torr. The ion source microwave power was about 200 W, and the ion flux was about 0.05 mA/cm$^{-2}$ at the substrate, with ion energies of about 40 eV to 50 eV.

For the samples with Sn concentrations in the range of $0.2\leq x\leq0.3$, in situ reflection high energy electron diffraction indicated atomically rough surfaces, but a single crystal diffraction pattern persisted with no evidence of twinning throughout the growth of $Sn_xGe_{1-x}$ layers more than 90 nm thick. For samples with Sn concentrations greater than 0.3, the diffraction intensity started to decrease after about 90 nm of $Sn_xGe_{1-x}$ film growth, indicating a reduction of epitaxial area. Optical microscopy inspections revealed optically smooth sample surfaces for tin concentrations less than 0.3 and optically rough surfaces covered with islands for tin concentrations larger than 0.3. Backscattering spectra of the alloy samples showed that tin incorporated uniformly into the $Sn_xGe_{1-x}$ alloy films for the samples with optically clear surfaces. Epitaxial $Sn_{0.30}Ge_{0.70}$ films 95 nm thick and $Sn_{0.26}Ge_{0.74}$ films 230 nm thick were obtained with uniform composition profiles by ion-assisted growth at 200° C.

A $Sn_xGe_{1-x}$ sample with a tin concentration of x=0.22 grown by ion-assisted molecular beam epitaxy was annealed at temperatures up to about 270° C. and monitored by in situ reflection high energy electron diffraction. The single crystal diffraction pattern persisted throughout the anneal. Post-anneal Rutherford backscattering analysis indicated no redistribution of the alloy composition profile, and optical microscopy showed optically clear sample surfaces after the annealing. The results suggest that the alloy sample was stable at the annealing temperatures.

Growth of $Sn_xGe_{1-x}$ Alloy Films by Conventional Molecular Beam Epitaxy

Four series of epitaxial samples having the following alloy compositions were prepared: $Sn_0Ge_{1.0}$ (pure germanium), $Sn_{0.06}Ge_{0.04}$, $Sn_{0.11}Ge_{0.89}$, and $Sn_{0.15}Ge_{0.85}$. Each sample series contained six samples having the same alloy composition but different thicknesses; the thicknesses were about 50, 100, 150, 200, 250 and 300 nm. Each sample was grown on double-side polished float-zone n-type silicon substrates with 2000 ohm-cm resistivity by molecular beam epitaxy (i.e., without ion irradiation). The substrate was cleaned and prepared as described above. During growth, the silicon substrates were first heated up to 550° C. to produce a 2×1 reconstructed clean silicon surface as indicated by in situ reflection high energy diffraction. For the pure germanium sample series, epitaxial germanium layers were grown at 450° C. growth temperature with a growth rate of 0.05 nm/sec. For all other samples, a 5 nm germanium buffer layer was first grown on the silicon substrate at 450° C. with a growth rate of 0.05 nm/sec. The substrate was then cooled to approximately 180° C. over a period of about one hour. Another 5 nm of germanium buffer was then grown at 180° C. to stabilize the growth rate of 0.05 nm/sec.

Epitaxial $Sn_xGe_{1-x}$ alloy layers were then grown at 180° C. and a rate of the 0.05 nm/sec. The germanium growth rate was feedback controlled by a quartz crystal thickness monitor adjacent to the sample and the tin growth rate was controlled by the voltage of the source heater.

Optical microscopy showed that all sample surfaces were optically clear. Atomic force microscopy over a few 500 nm×500 nm areas on the $Sn_{0.15}Ge_{0.85}$ sample (300 nm thick) showed that the root-mean-square surface roughness was approximately 0.6 nm and the maximum peak-to-valley roughness was about 4 nm. The compositions and thickness of the samples were measured by Rutherford backscattering spectroscopy which also confirmed uniform alloy composition (i.e., negligible Sn segregation) in the alloy films.

In-plane, out-of-plane, and relaxed lattice parameters of the epitaxial films determined from the peak shift relative to the silicon substrate peak in the 400 and 440 x-ray diffraction curves indicated that the films are fully relaxed (i.e., strain relieved) within experimental resolution. Mossbauer spectrometry and Raman spectroscopy indicated Sn incorporation into a substitutional diamond cubic alloy.

$Sn_xGe_{1-x}$ energy band gap as a function of alloy composition

Energy band gap as a function of $Sn_xGe_{1-x}$ alloy composition was determined quantitatively from the onset of the interband absorption edge in the absorption spectrum for each $Sn_xGe_{1-x}$ alloy. Thin film interference effects stemming from the $Sn_xGe_{1-x}$ alloy films were accounted for in the analysis of optical constants. Optical constants (i.e., refractive index and extinction coefficient) of $Sn_xGe_{1-x}$ as a function of wavelength (i.e, photon energy) were determined (without ambiguities from the thin film interference effects) for different $Sn_xGe_{1-x}$ alloy film thicknesses. To obtain information on the optical constants, optical transmission spectra were experimentally measured as a function of the $Sn_xGe_{1-x}$ film thickness using Fourier transform infrared spectroscopy (FTIR). The optical transmission spectra contained information from which the refractive index and the extinction coefficient for each alloy could be determined. The optical constants spectra were then used to calculate the optical absorption spectra from which $Sn_xGe_{1-x}$ band gap information was obtained. A numerical model was used to calculate the multilayer thin film interference effects through exact solutions of Maxwell's equations in the multilayer structures. The model involved fitting the measured spectra to a transmission function through minimizing the $\chi^2$ (chi-square) function. which is defined as $$\chi(\omega)^2 = \sum_{i=1}^{N} \left( \frac{T(\omega)_i - T_{di}(n(\omega), k(\omega), \omega)}{\sigma_i} \right)^2$$

where T(w) is the optical transmission, d is the film thickness, n(w) is the refractive index, k(w) is the extinction coefficient, N is the total number of different measurements, and $\sigma_i$ are the standard deviations of the transmission measurement errors. The $\chi2$ analysis permits errors to be estimated statistically. The standard error of a fitted parameter a (a can be either n(w) or k(w)) can be estimated as $$\sigma_a(\omega) = \sqrt{\sum_{i=1}^{N} \left( \sigma_i(\omega) / \frac{\partial T_{di}}{\partial a}(\omega) \right)^2}.$$

For measurement uncertainties $\sigma_i$ are not known in advance but an estimation can be made if it is assumed that the model fits well and all measurements have the standard deviation as $$\sigma_i(\omega) = \sigma(\omega) = \sqrt{\sum_{i=1}^{N} (T_i(\omega) - T_{di}(n(\omega), k(\omega), \omega))^2 / (N - M)}$$

where M is the number of fitting parameters (M=2 in the case of optical constants).

The measured thickness-dependent transmission spectra were then fit to the numerical interference model through $\chi^2$ (chi-square) minimization analysis to obtain the optical constants spectra with error estimations established through $\chi^2$ error analysis.

The optical transmission spectra for each alloy composition and film thickness were measured using a Nicolet 60SX Fourier transform infrared spectrometer with 5 $cm^{-1}$ resolution. The spectrometer was purged continuously with dry nitrogen at approximately 4 l/min during measurements to avoid ambient vapor (e.g., water and carbon dioxide) absorption. The source beam was projected to the sample from the back side of the substrate at normal incidence. Two sets of apertures were used to restrict the beam size to about 10 mm in diameter, and the beam convergence angle to about 0.1 rad. Each optical transmission spectrum was calculated by dividing the transmitted intensity of the sample, by the through-beam intensity measured right after the sample measurement. The tin concentrations in the alloy films had a 10% relative variation across the 10 mm measurement area on the samples due to source configuration.

Optical constant analysis was performed on the sample spectra of each alloy to determine the band gap for each alloy. Optical constant spectra (i.e., the refractive index spectrum and the extinction coefficient spectrum) for the alloy films were calculated by fitting the experimentally measured thickness-dependent transmission spectra to the numerical optical transmission function, which includes multilayer interference. The transmission spectra were first normalized by the transmission spectra of the reference silicon wafer before the fitting. The fittings were performed numerically using a modified Levenberg-Marquardt method. The 200 nm $Sn_{0.15}Ge_{0.85}$ sample was excluded from the data analysis because it showed a very large discrepancy with the other samples in the same series when included in the fitting, which suggested a bad sample quality. This was confirmed by high-resolution x-ray diffraction measurement which showed a very weak diffraction intensity with a very broad angular width, suggesting a bad epitaxial quality of the sample.

Figure 4:
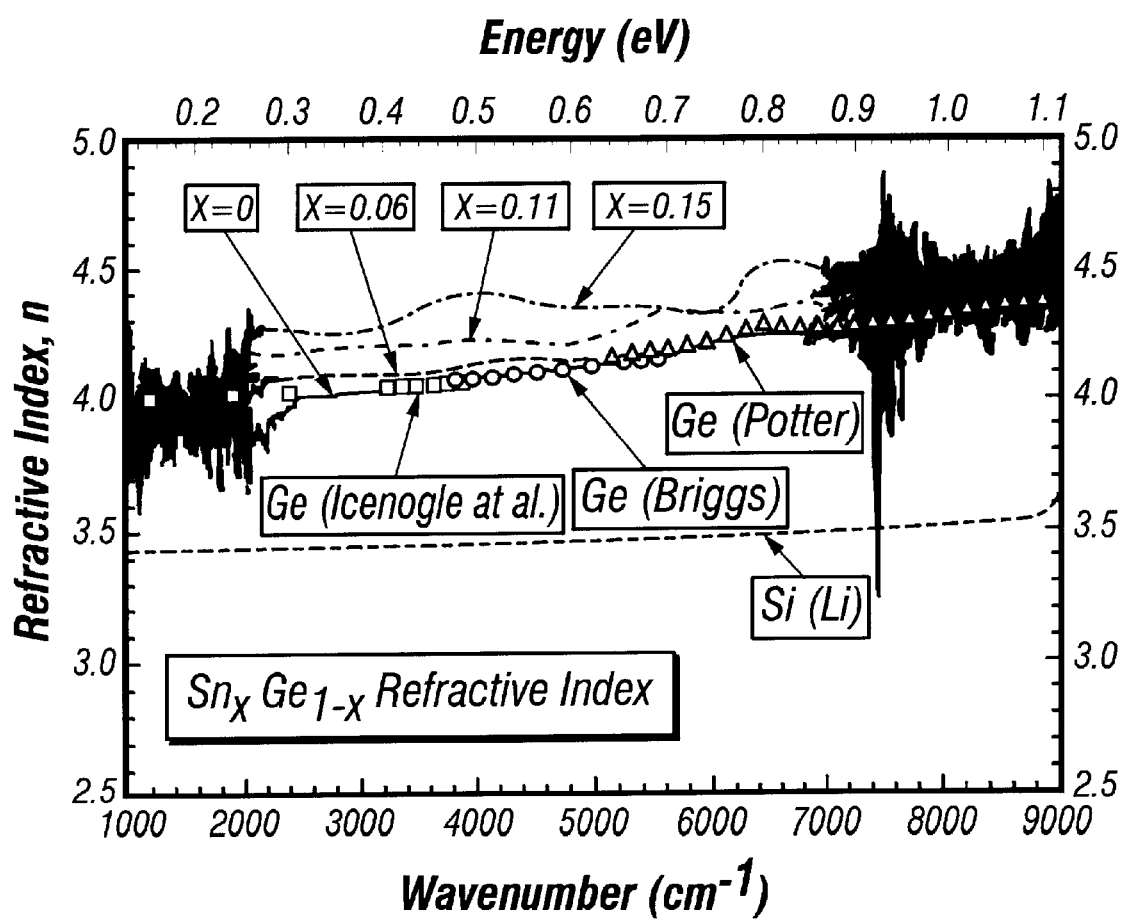
FIG. 4 is a plot of the refractive index of: $Sn_xGe_{1-x}$ analyzed from thickness-dependent transmission spectra; pure silicon; and pure germanium.

Referring to FIG. 4, the calculated refractive index spectra, which resulted from the above-described calculation, for each of the $Sn_xGe_{1-x}$ alloy films demonstrates increasing refractive index with increasing tin concentration, from n=4.0 for x=0 to n=4.3 for x=0.15, at long wavelengths. The fluctuations at 0.93 eV are due to an instrument artifact of a near-zero minimum in the instrumental response function and the fluctuations below 0.25 eV are due to the multi-phonon lattice absorption in the silicon substrate.

Figure 5:
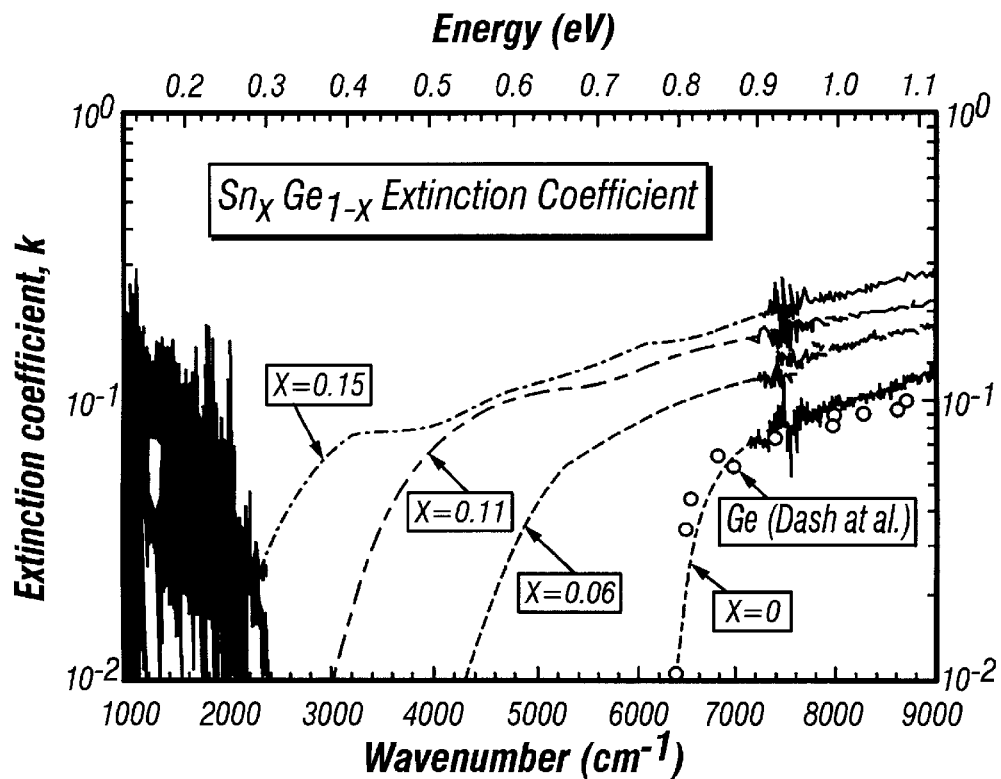
FIG. 5 is a plot of the extinction coefficient of $Sn_xGe_{1-x}$ analyzed from thickness-dependent transmission spectra, compared with that of pure germanium.

Referring to FIG. 5, the calculated extinction coefficient spectra of each $Sn_xGe_{1-x}$ alloy film are shown. The spectra demonstrate decreasing onset energy for strong absorption with increasing tin concentration, from about 0.8 eV for x=0 to about 0.25 eV for x=0.15. The measured extinction coefficient for the pure germanium samples matches the data for pure germanium in the literature. The fluctuations at 0.93 eV are due to the instrument artifact of a near-zero minimum in the instrumental response function and the fluctuations below 0.25 eV are due to the multi-phonon lattice absorption in the silicon substrate.

Figure 6:
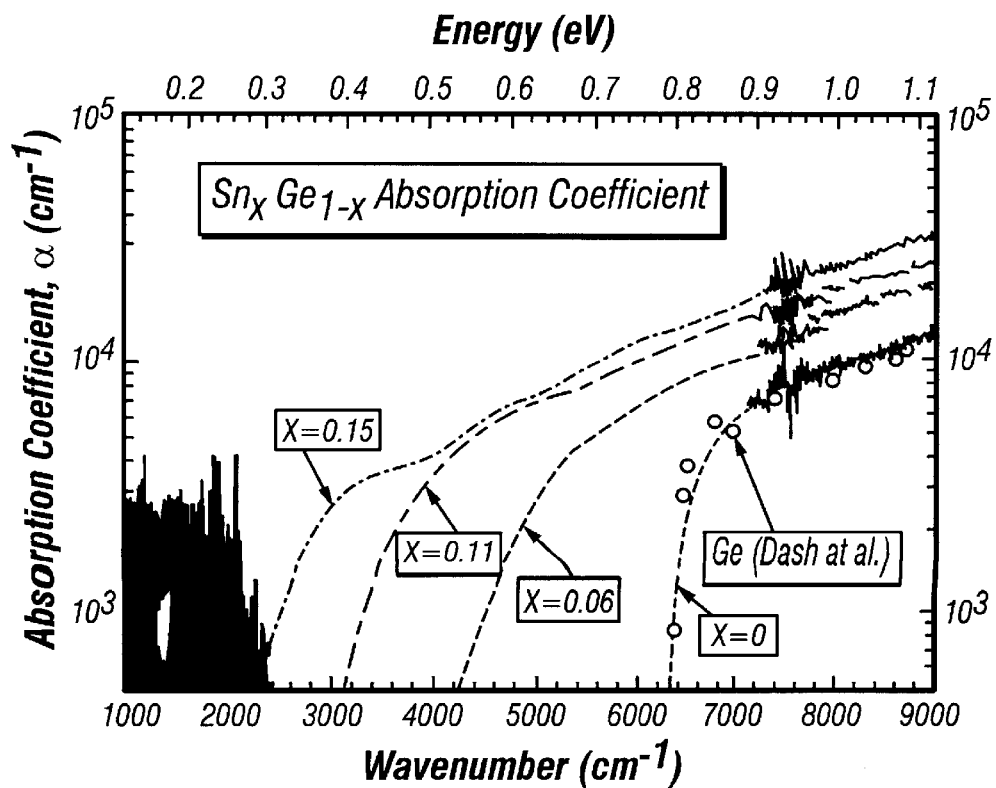
FIG. 6 is a plot of the absorption coefficient of $Sn_xGe_{1-x}$ analyzed from the measured extinction coefficient, compared with that of pure germanium.

Absorption coefficient spectra, calculated from the measured extinction coefficient spectra for each of the $Sn_xGe_{1-x}$ alloys, are shown in FIG. 6. The absorption onset at 0.8 eV in the measured spectrum of the pure germanium samples corresponds to the 0.8 eV direct band gap of germanium instead of its 0.67 eV indirect fundamental band gap, which has a much weaker absorption that is below the detection sensitivity of the Fourier Transform infrared spectrometer for a 0–300 nm thick germanium film. This suggests that the absorption onsets indicated by the measured absorption spectra of the $Sn_xGe_{1-x}$ alloys correspond to an interband transition, but not necessarily a transition between the fundamental band gaps since there might be a smaller indirect energy band gap with very weak absorption below the detection limit.

Figure 7:
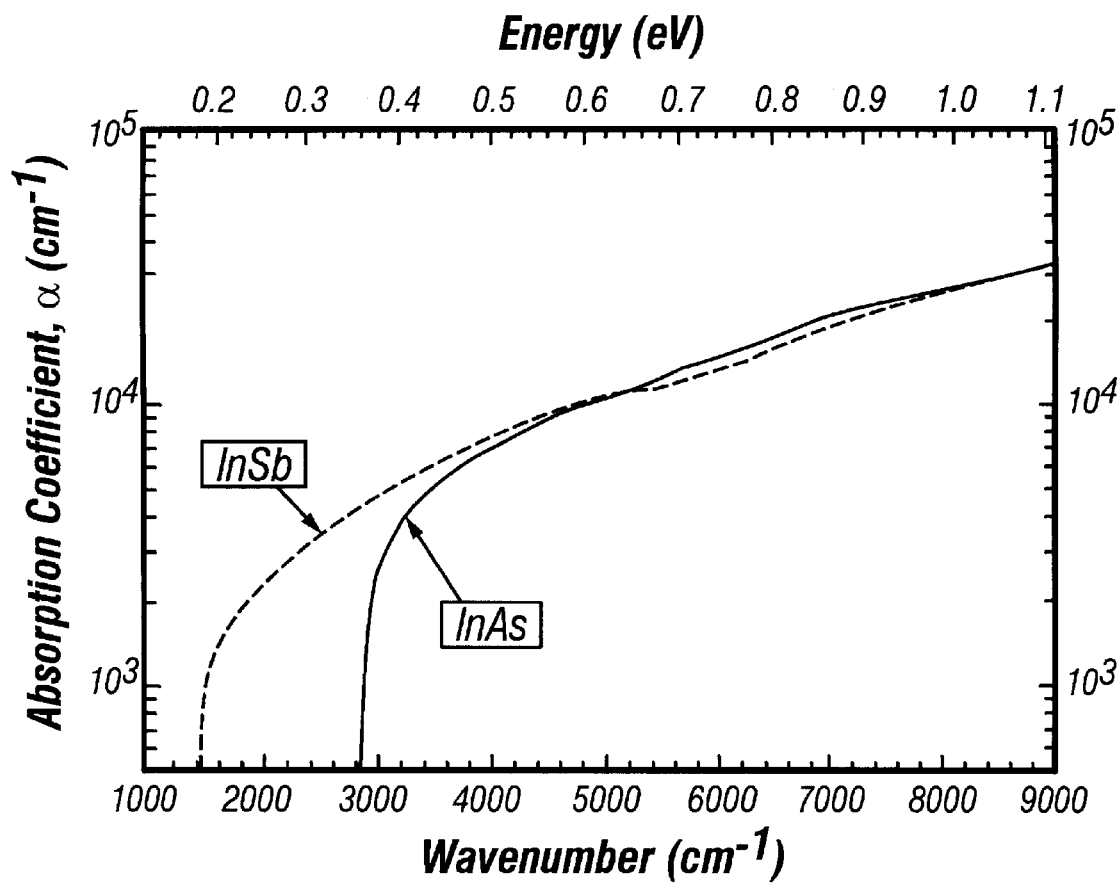
FIG. 7 is a plot of the absorption coefficient of InAs and InSb.

The measured absorption coefficients of the $Sn_xGe_{1-x}$ alloys are of the order of $10^3$ to $10^4$ cm$^{-1}$ near the absorption onset, which are consistent with interband transitions across the direct energy band gap. Using parabolic band approximation, the absorption edge is expected to have a power dependence of 0.5 on energy for direct band gaps and a power dependence of 2 for indirect band gaps. Due to the experimental sensitivity limit, absorption coefficients below about 500 cm$^{-1}$ near the absorption edges were not available for such power law fitting. The absorption curves above the detection limit fitted roughly a power dependent of about 1 over a range of about 0.2 eV from the absorption onset, but with a very large uncertainty (about 0.5) due to the lack of information at the low absorption regions as well as the uncertainty limitations established by the error analyses. The $Sn_xGe_{1-x}$ alloy films used from this measurement are relatively heavily doped ($10^{17}$ to $10^{18}$), and that there is a 10% relative nonuniformity in tin concentration across the 10 mm optical measurement area which broadens the measured absorption edge hence increasing the apparent power dependence. These observations suggest that the measured absorption edges of the $Sn_xGe_{1-x}$ alloys are consistent with optical transitions across a direct band gap. The measured absorption strength and spectral range of the $Sn_xGe_{1-x}$ alloys are comparable with typical narrow direct band gap semiconductors such as InAs and InSb as shown in FIG. 7.

The measured energy band gap and refractive index of the $Sn_xGe_{1-x}$ alloys does not follow the Moss rule which states that the fourth power of refractive index scales inversely with the energy band gap. Such a discrepancy is not surprising considering that diamond-cubic tin, one of the constituents of the $Sn_xGe_{1-x}$ alloys, does not follow the Moss rule since it has a zero energy band gap and a refractive index of about n=4.9. Narrow band gap semiconductors InAs and InSb are also well known exceptions to the Moss rule.

Figure 8:
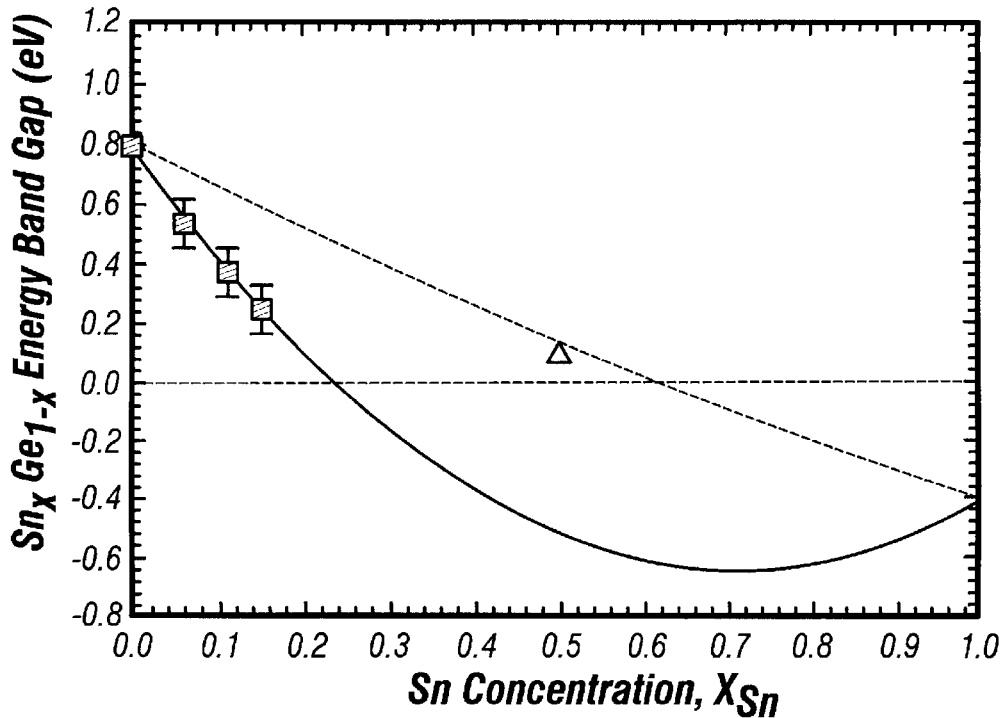
FIG. 8 is a plot of $Sn_xGe_{1-x}$ energy band gaps measured from the absorption onset as a function of alloy composition compared with tight-binding calculations of $Sn_xGe_{1-x}$ alloys and density functional calculation of zinc-blend SnGe. The estimated error in the measured data is represented by the error bars in the vertical dimension and by the size of the squares in the horizontal dimension.

Referring to FIG. 8, the measured onsets of absorption of the $Sn_xGe_{1-x}$ alloys plotted as a function of tin concentration demonstrate that the measured band gap decreases with increasing tin concentration much faster than predicted by the tight binding and pseudopotential calculations in the virtual crystal approximation. Possible sources of error in the measured energy band gap include random errors characterized by the $\chi^2$ error analysis, as well as the possible band gap shift from small residual epitaxial strains in the alloy films. The random error is estimated to be within 40 meV from the $\chi^2$ error analysis, and the error induced by residual strain is estimated to be also within about 40 meV from the x-ray diffraction strain measurements and assuming a deformation potential of pure germanium. Although band filling effects may slightly affect the measured band gaps for heavily doped semiconductors, such effects tend to increase the measured band gaps in general. If the measured band gaps of the $Sn_xGe_{1-x}$ alloys as a function of alloy composition are connected with the established band gap of pure diamond-cubic $\alpha$-Sn of $E_g$=0.4 eV through a parabolic fit:

$$E_g = E_{g0}(1-x) + E_{g1}x + E_\alpha x(x-1),$$

a bowing parameter of $E_\alpha$=2.8 eV is obtained, although the value may contain some significant error due to the lack of data points in the mid composition range. The measured energy band gaps of the $Sn_xGe_{1-x}$ alloys suggest that the alloy band gaps may become zero at tin concentration less than x=0.25 instead of x=0.6 as predicted by the tight-binding and pseudopotential calculations.

Uses for $Sn_xGe_{1-x}$ Alloys $Sn_xGe_{1-x}$ alloys are useful for silicon-based high-performance electronic devices composed of strained or unstrained heterojunction layers on silicon substrates. $Sn_xGe_{1-x}$ alloys also have application in silicon-based infrared optoelectronic devices due to their continuously tunable band gaps in the infrared region. Monolithic integration of infrared devices with silicon technology enables a new array of applications including monolithically infrared imaging arrays fabricated on integrated circuits.

Figure 9:
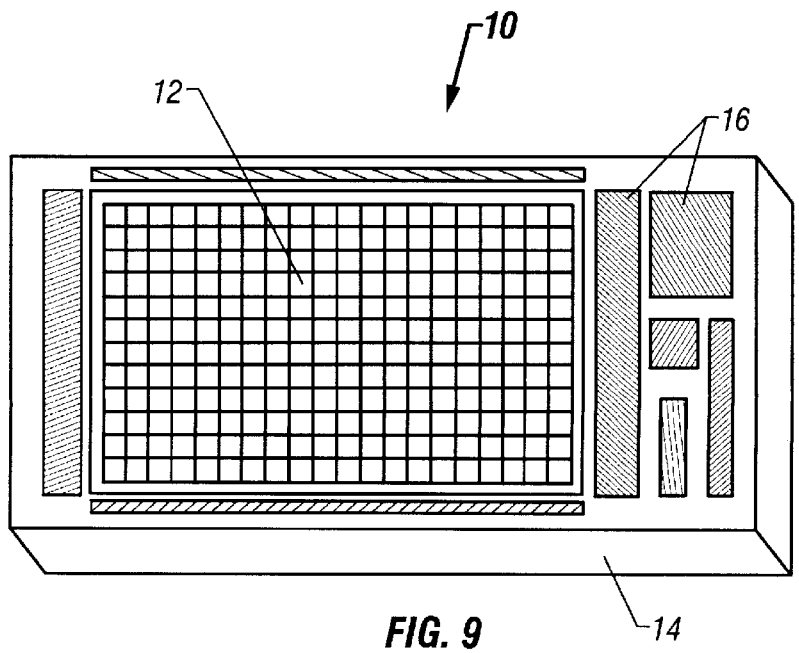
FIG. 9 is a schematic view of a monolithic infrared detector array incorporating $Sn_xGe_{1-x}$ epitaxial layers grown on a substrate containing an integrated circuit.

The low growth temperature of epitaxial $Sn_xGe_{1-x}$ alloys permits the fabrication of the $Sn_xGe_{1-x}$ alloy layers as one of the last processing step on an almost fully processed integrated circuit without affecting the existing devices already fabricated on the wafer. Thus, the $Sn_xGe_{1-x}$ layer can be built on the same chip as integrated supporting electronic circuits (e.g., read-out driving circuit). For example, $Sn_xGe_{1-x}$ can be used as the active detector element in a monolithic infrared detector array (e.g., photovoltaic and photoconductive infrared arrays). Referring to FIG. 9, monolithic integrated infrared detector array 10 includes a $Sn_xGe_{1-x}$ epi-layer 12 grown on substrate 14 (e.g., a silicon or germanium substrate), containing integrated supporting circuitry 16. The integrated supporting electronic circuits can include a variety of features including p$^-$ doped and n$^-$ doped regions performing various functions, e.g., transistors.

What is claimed is:

1. A $Sn_xGe_{1-x}$ alloy device, comprising:
   a substrate formed of silicon or germanium;
   at least one circuit layer formed on said substrate and having integrated circuit elements; and
   a $Sn_xGe_{1-x}$ alloy formed above said at least one circuit layer and integrated to at least one of said integrated circuit elements, said $Sn_xGe_{1-x}$ alloy substantially free of compositional inhomogeneities and Sn segregation, and having a measurable direct band gap.

2. The $Sn_xGe_{1-x}$ alloy device of claim 1, wherein said direct band gap is in the range of about 0.62 eV to about 0 eV.

3. The $Sn_xGe_{1-x}$ alloy device of claim 1, wherein said direct band gap is in the range of about 0.62 eV to about 0.35 eV.

4. The $Sn_xGe_{1-x}$ alloy device of claim 1, wherein said direct band gap is no greater than about 0.20 eV.

5. The $Sn_xGe_{1-x}$ alloy device of claim 1, wherein $0<x\leq0.34$.

6. The $Sn_xGe_{1-x}$ alloy device of claim 1, wherein $0<x\leq0.30$.

7. The $Sn_xGe_{1-x}$ alloy device of claim 1, wherein $0<x\leq0.22$.

8. The $Sn_xGe_{1-x}$ alloy device of claim 1, wherein $0.06<x\leq0.22$.

9. The $Sn_xGe_{1-x}$ alloy device of claim 1, wherein $0.06<x\leq0.15$.

10. The $Sn_xGe_{1-x}$ alloy device of claim 1, wherein $0.11 < x \leq 0.15$.

11. A monolithic integrated semiconductor device comprising a $Sn_xGe_{1-x}$ alloy on a silicon or germanium substrate, at least one circuit layer formed over the substrate and having an integrated circuit element, wherein said $Sn_xGe_{1-x}$ alloy is formed over the at least one circuit layer at a temperature no greater than 200° C., subsequent to formation of the at least one circuit layer, and wherein said $Sn_xGe_{1-x}$ alloy is substantially free of compositional inhomogeneities and Sn segregation, and has a measurable direct band gap.

* * * * *